United States Patent
Strong et al.

(10) Patent No.: US 12,525,496 B2
(45) Date of Patent: Jan. 13, 2026

(54) GLASS VIAS AND PLANES WITH REDUCED TAPERING

(71) Applicant: Intel Corporation, Santa Clara, CA (US)

(72) Inventors: Veronica Strong, Hillsboro, OR (US); Telesphor Kamgaing, Chandler, AZ (US); Aleksandar Aleksov, Chandler, AZ (US); Georgios C. Dogiamis, Chandler, AZ (US); Brandon Rawlings, Chandler, AZ (US); Neelam Prabhu Gaunkar, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 875 days.

(21) Appl. No.: 17/557,913

(22) Filed: Dec. 21, 2021

(65) Prior Publication Data

US 2023/0197541 A1   Jun. 22, 2023

(51) Int. Cl.
*H01L 23/48* (2006.01)
*H01L 23/15* (2006.01)
*H01L 23/498* (2006.01)
*H01L 29/40* (2006.01)

(52) U.S. Cl.
CPC ............ *H01L 23/15* (2013.01); *H01L 23/481* (2013.01); *H01L 23/49816* (2013.01); *H01L 23/49827* (2013.01); *H01L 23/49838* (2013.01)

(58) Field of Classification Search
CPC . H01L 23/15; H01L 23/481; H01L 23/49816; H01L 23/49827; H01L 23/49838; H01L 21/486

USPC ........................................................ 257/774
See application file for complete search history.

(56) References Cited

U.S. PATENT DOCUMENTS

| 7,211,899 B2 | 5/2007 | Taniguchi et al. |
| 2011/0147059 A1 | 6/2011 | Ma |
| 2011/0229687 A1 | 9/2011 | Gu |
| 2014/0097013 A1* | 4/2014 | Hara .............. H01L 23/49822 174/266 |
| 2019/0185373 A1 | 6/2019 | Hu |
| 2020/0203266 A1* | 6/2020 | Iwai .............. H01L 23/49822 |

OTHER PUBLICATIONS

Search Report from European Patent Application No. 22206306.7, mailed Jun. 20, 2023, 9 pgs.

* cited by examiner

*Primary Examiner* — Theresa T Doan
(74) *Attorney, Agent, or Firm* — Schwabe, Williamson & Wyatt P.C.

(57) ABSTRACT

Embodiments disclosed herein include an electronic package that comprises a substrate with a first surface and a second surface opposite from the first surface. In an embodiment, the substrate comprises glass. In an embodiment, the electronic package further comprises an opening through the substrate from the first surface to the second surface, where the opening comprises a first end proximate to the first surface of the substrate, a second end proximate to the second surface of the substrate, and a middle region between the first end and the second end. In an embodiment, the middle region has a discontinuous slope at junctions with the first end and the second end.

21 Claims, 14 Drawing Sheets

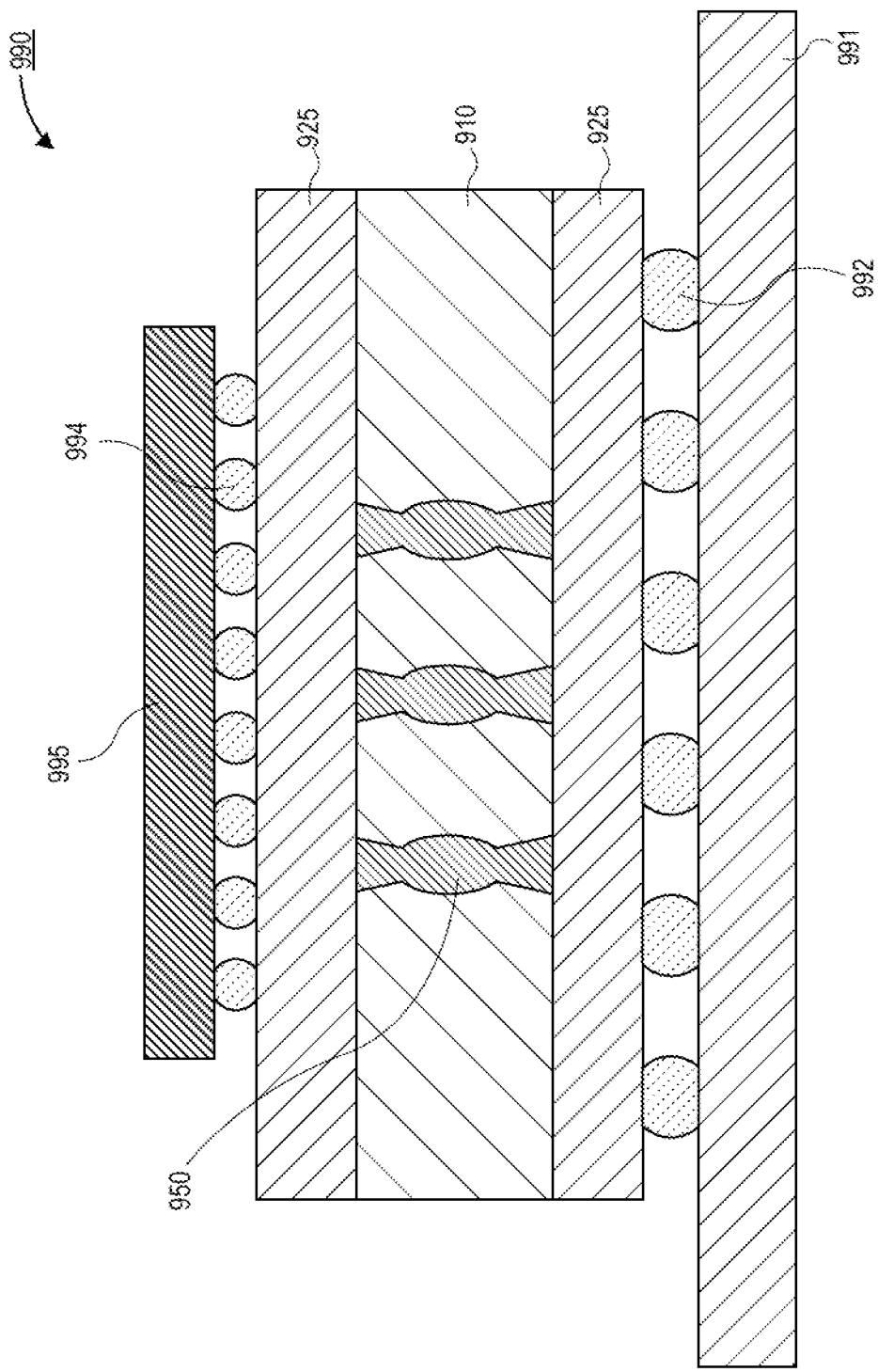

GLASS VIAS AND PLANES WITH REDUCED TAPERING

TECHNICAL FIELD

Embodiments of the present disclosure relate to electronic packages, and more particularly to electronic packages with vias and planes through a glass core with reduced tapering.

BACKGROUND

In electronic packages with glass cores, laser assisted etching has been proposed in order to form vias and other structures in the glass core. However, laser assisted etching process may be limited by tapering of the via diameter from a maximum at the surface of the glass core to a minimum at the bilateral mid-plane. For some types of glass relevant to high-speed signaling, vias that are nominally 20 microns in diameter at the surface are less than 10 microns in diameter at the center of a 500 micron thick glass substrate.

It is to be appreciated that via narrowing at the center of the glass core may result in obstacles that need to be addressed. For one, in the case of power delivery structures, the narrowing of the vias or planes may result in current crowding at the midpoint. As such, resistances of the structures may be increased. Additionally, for signaling applications, the tapered structure may generate problems with insertion loss optimization. Furthermore, it is to be appreciated that the extent of via narrowing may be determined, at least in part, by the type of glass that is used. Generally, more expensive glass materials are less susceptible to via narrowing. Accordingly, current designs cannot be manufactured on lower cost glass substrates, and this increases the cost of the electronic package.

BRIEF DESCRIPTION OF THE DRAWINGS

FIG. 9 is a cross-sectional illustration of an electronic system with vias in a glass core with reduced diameter narrowing at a midpoint of the vias, in accordance with an embodiment.

EMBODIMENTS OF THE PRESENT DISCLOSURE

Figure 1A:
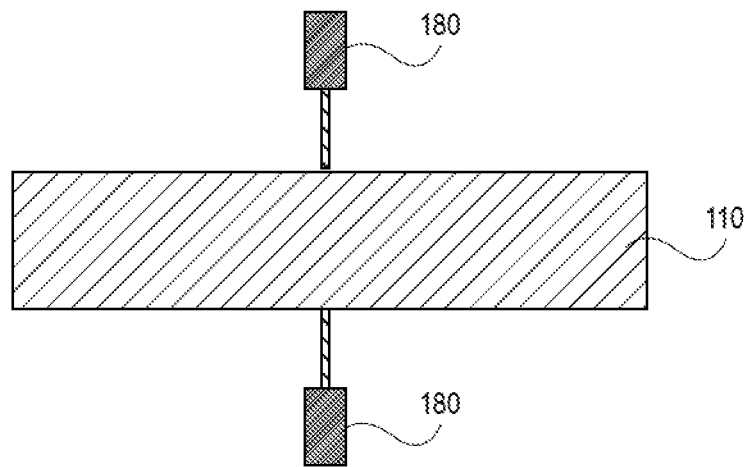
FIGS. 1A-1C are cross-sectional illustrations depicting a laser assisted etching process for forming vias through a core, in accordance with an embodiment.

Described herein are electronic packages with vias and planes through a glass core with reduced tapering, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, via tapering is one design limitation that is faced in the use of laser assisted etching in glass core architectures. Particularly, the narrowing of the vias and planes may result in power delivery limitations, as well as limiting designs to optimize insertion loss. Additionally, high cost glass substrates are currently needed in order to mitigate the via narrowing.

Accordingly, embodiments disclosed herein include methods and architectures that mitigate via (and plane) narrowing. Control of the via taper during etching improves the ability of later-deposited materials to be deposited uniformly on the via sidewalls. Such embodiments also protect against the possibility of current crowding at the midpoint of the via. For signaling applications, a wider range of via shapes are enabled. This added flexibility allows for optimizing insertion loss and leads to better signaling performance. In yet another benefit, lower cost glass substrates may be used since the via tapering is mitigated with process flows described herein.

As will be described in greater detail below, embodiments disclosed herein may use laser assisted etching processes in order to form vias through the core or blind vias into the core. The laser assisted etching processes may result in the undesirable tapering. Accordingly, embodiments disclosed herein include post processing operations that are used to mitigate the tapering that was formed during the laser assisted etching process. For example, hardmask materials may be disposed over top and bottom regions of the via openings, leaving a middle region of the via opening exposed. The middle region may then be selectively etched in order to reduce (or eliminate) the taper present at the middle region of the via opening. In some instances, the selective etching process may result in via openings that have concave surfaces at the middle region. In some embodiments, the hardmask persists into the final structure of the electronic package. In other embodiments, the hardmask is removed before deposition of conductive material to form the vias.

In the embodiments described herein, reference will be made to via openings and vias. However, it is to be appreciated that embodiments are equally applicable to structures such as via planes. A via plane is essentially the lateral extension of a via in order to form a plane within the core. The cross-section of a via plane may, therefore, have a cross-section that is substantially similar to the cross-section of a via.

Figure 1B:
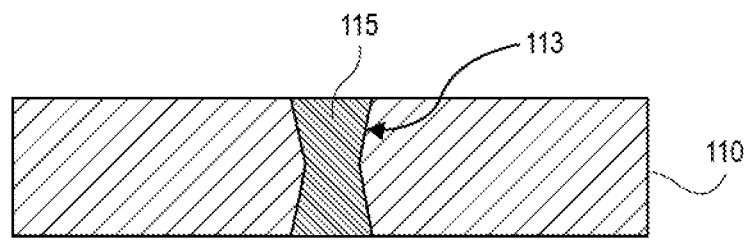
Figure 1C:
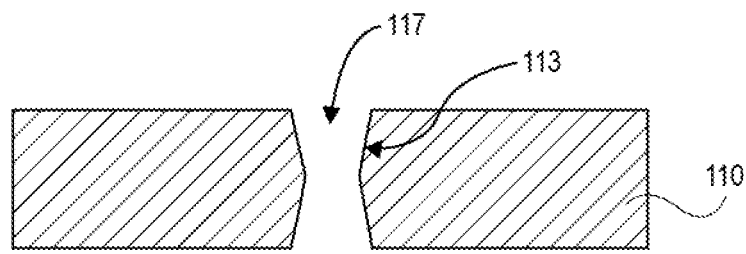
Figure 2A:
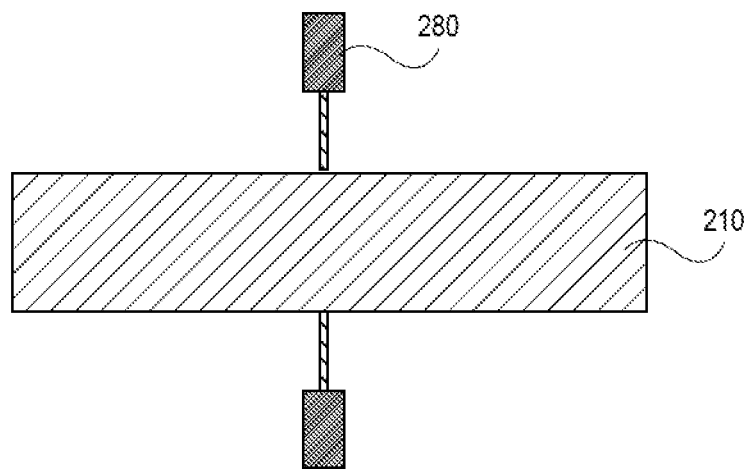
FIGS. 2A-2C are cross-sectional illustrations depicting a laser assisted etching process for forming blind vias into a core, in accordance with an embodiment.
Figure 2B:
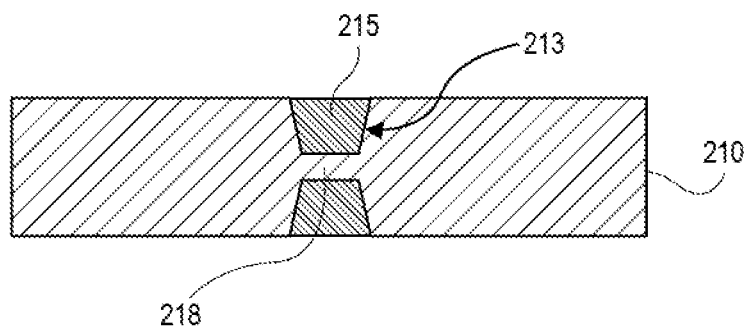
Figure 2C:
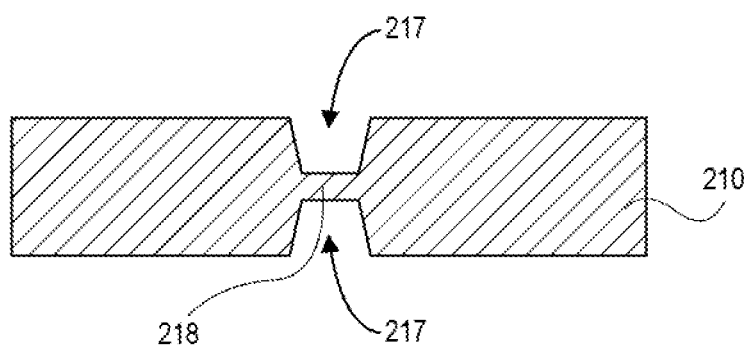
Figure 3A:
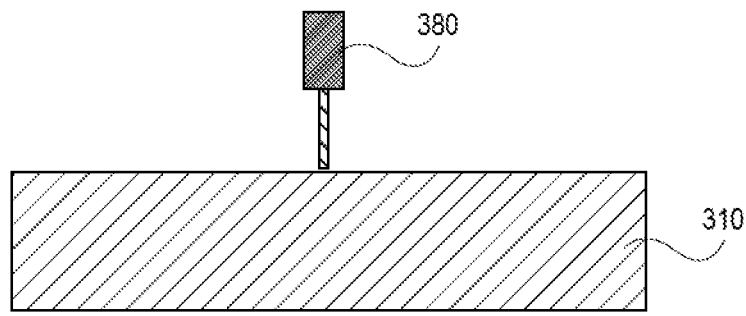
FIGS. 3A-3C are cross-sectional illustrations depicting a laser assisted etching process for forming a blind via into a core, in accordance with an embodiment.
Figure 3B:
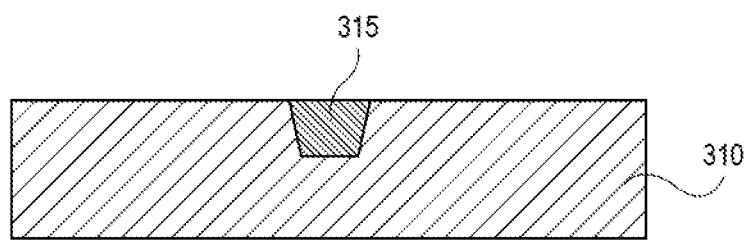
Figure 3C:
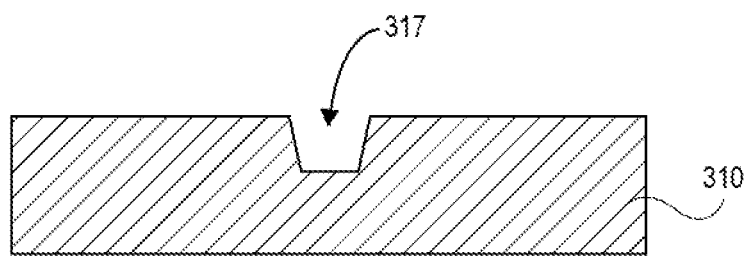

In order to provide context, FIGS. 1A-3C, are three series of cross-sectional illustrations that depict processes for forming features in glass cores with laser assisted etching processes. In FIGS. 1A-1C, a through core via opening is formed. In FIGS. 2A-2C a pair of blind via openings on opposite surfaces of the core are formed. In FIGS. 3A-3C a blind via opening into the top surface of the core is formed. The openings formed in FIGS. 1A-3C can then be filled with materials (e.g., conductive materials) using various plating or other deposition processes in order to manufacture HSIO traces and ground traces/planes within a glass core. However, as illustrated, these process flows each result in the formation of structures with diameter narrowing towards the midline of the substrate.

Referring now to FIGS. 1A-1C, a series of cross-sectional illustrations depicting a process for fabricating openings in a glass core 110 is shown, in accordance with an embodiment.

Referring now to FIG. 1A, a cross-sectional illustration of a glass core 110 is shown, in accordance with an embodiment. In an embodiment, the glass core 110 may have a thickness that is between approximately 50 μm and approximately 1,000 μm. As used herein, approximately may refer to a value that is within 10% of the stated value. For example, approximately 50 μm may refer to a value between 45 μm and 55 μm. Though, it is to be appreciated that other thicknesses (larger or smaller) may also be used for the glass core 110. In an embodiment, a laser 180 is used to expose a region of the glass core 110. As shown in FIG. 1A, the exposure may be made on both sides (i.e., the top surface of the glass core 110 and the bottom surface of the glass core 110). A single laser 180 may be used, or multiple lasers may be used. In an embodiment, the laser 180 is exposed over the glass core 110 at locations where via openings are desired.

Referring now to FIG. 1B, a cross-sectional illustration of the glass core 110 after the laser 180 exposure is completed is shown, in accordance with an embodiment. As shown, the laser 180 exposure may result in the formation of exposed regions 115. In an embodiment, the glass core 110 may comprise a glass material that is able to be morphologically changed upon exposure to a laser 180. For example, the morphological change may result in the microstructure of the glass core 110 transforming to a crystalline structure from an amorphous structure. Accordingly, the exposed region 115 is shown with a different shading than the glass core 110.

In an embodiment, the laser 180 exposure may result in an exposed region 115 that has a tapered sidewall 113. In the instance where both sides of the glass core 110 are exposed (as is the case shown in FIG. 1A), the exposed region 115 may have a double tapered profile. That is, widths of the exposed region 115 at a top surface of the glass core 110 and at a bottom surface of the glass core 110 may be wider than a width at a middle of the glass core 110. In some instances, such a sidewall 113 profile may be referred to as an hourglass shaped profile.

Referring now to FIG. 1C, a cross-sectional illustration of the glass core 110 after the exposed region 115 is removed is shown, in accordance with an embodiment. In an embodiment, removal of the exposed region 115 may result in the formation of a via opening 117. The via opening 117 may pass entirely through a thickness of the glass core 110. In an embodiment, the via opening 117 may be a high aspect ratio via opening 117. As used herein a "high aspect ratio" may refer to an aspect ratio (depth:width) that is approximately 5:1 or greater, with the width being measured at a narrowest point through a thickness of the via opening 117. In other embodiments, the aspect ratio of the via opening 117 may be approximately 10:1 or greater, approximately 20:1 or greater, or approximately 50:1 or greater.

Referring now to FIGS. 2A-2C, a series of cross-sectional illustrations depicting a process for forming blind structures into a glass core 210 is shown, in accordance with an embodiment. Instead of forming an opening entirely through the glass core 210, structures that extend partially through a thickness of the core 210 are provided.

Referring now to FIG. 2A, a cross-sectional illustration of a glass core 210 is shown, in accordance with an embodiment. In an embodiment, the glass core 210 may be substantially similar to the glass core 110 described in greater detail above. For example, the glass core 210 may have a thickness between approximately 50 μm and approximately 1,000 μm. In an embodiment, lasers 280 may expose portions of the glass core 210. In an embodiment, the laser 280 exposure in FIG. 2A may be different than the laser 180 exposure in FIG. 1A. For example, an intensity or duration of the laser 280 exposure may be less than the intensity or duration of the laser 180 exposure in FIG. 1A.

Referring now to FIG. 2B, a cross-sectional illustration of the glass core 210 after exposed regions 215 are formed is shown, in accordance with an embodiment. In an embodiment, the exposed regions 215 do not extend entirely through a thickness of the glass core 210. For example, a region 218 may be provided between the top exposed region 215 and the bottom exposed region 215. In some instances, the exposed regions 215 still include tapered sidewalls 213. Since the exposed regions 215 are formed from only a single side, the sidewalls 213 may only have a single taper. That is, the exposed regions 215 may not be hourglass shaped.

Referring now to FIG. 2C, a cross-sectional illustration of the glass core 210 after the exposed regions 215 are removed to form openings 217 is shown, in accordance with an embodiment. In an embodiment, the exposed regions 215 may be removed with an etching process that is selective to the exposed regions 215 over the rest of the glass core 210. As shown, the openings 217 do not extend entirely through the glass core 210. In such embodiments, the openings 217 may be referred to as blind openings since they do not pass through the glass core 210.

Referring now to FIGS. 3A-3C, a series of cross-sectional illustrations depicting a process for forming a blind opening 317 is shown, in accordance with an embodiment.

Referring now to FIG. 3A, a cross-sectional illustration of a glass core 310 is shown, in accordance with an embodiment. In an embodiment, the glass core 310 may be substantially similar to the glass cores 110 and 210 described in greater detail above. For example, the glass core 310 may have a thickness between approximately 50 μm and approximately 1,000 μm. In an embodiment, a laser 380 may be used to expose a surface of the glass core 310. In contrast to embodiments described in greater detail above, the laser 380 exposure may only be provided on a single surface of the glass core 310.

Referring now to FIG. 3B, a cross-sectional illustration of the glass core 310 after the laser exposure to form an exposed region 315 is shown, in accordance with an embodiment. In an embodiment, the exposed region 315 may be a region that has a morphology change compared to the rest of the glass core 310. For example, the morphology change may be the transition from an amorphous structure to a crystalline structure. In an embodiment, the exposed region 315 may not extend entirely through a thickness of the glass core 310. That is, the exposed region 315 may be suitable for forming blind structures.

However, it is to be appreciated that in some embodiments, a laser 380 exposure on a single surface of the glass core 310 can be used to form an exposed region 315 that extends through an entire thickness of the glass core 310. That is, it is not necessary to use an exposure on both sides of the glass core 310 in order to form through core structures. In such an embodiment, the sidewall profile of the exposed region 315 may have a single taper, instead of the hour-glass shaped taper shown in FIG. 1B.

Referring now to FIG. 3C, a cross-sectional illustration of the glass core 310 after the exposed region 315 is removed is shown, in accordance with an embodiment. In an embodiment, the removal of the exposed region 315 may result in an opening 317 being formed into the surface of the glass core 310. In an embodiment, the opening 317 may be a blind opening. In other embodiments, the opening 317 may pass entirely through a thickness of the glass core 310.

Referring now to FIGS. 4A-4E, a series of cross-sectional illustrations depicting a process for fabricating vias through a glass core with minimal tapering is shown, in accordance with an embodiment. As illustrated in FIGS. 4A-4E, the via openings are formed using standard laser assisted etching processes, and are subsequently processed in order to remove the unwanted taper at a center region of the via openings. After the taper is reduced or eliminated, conductive material may be deposited in the via opening to form a via structure.

Figure 4A:
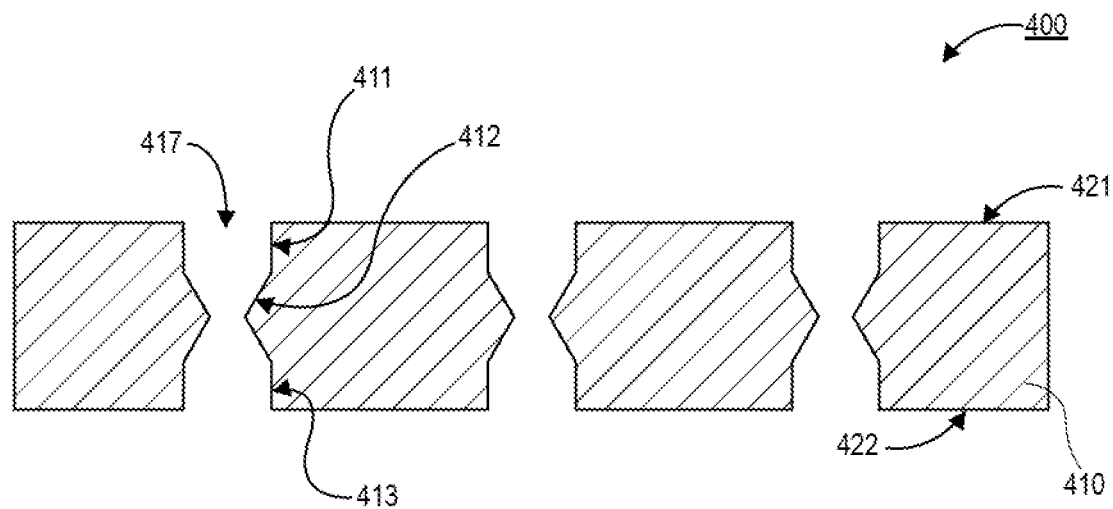
FIGS. 4A-4E are cross-sectional illustrations depicting a process for reducing the taper in via openings through a glass substrate, in accordance with an embodiment.

Referring now to FIG. 4A, a cross-sectional illustration of an electronic package 400 is shown, in accordance with an embodiment. In an embodiment, the electronic package 400 comprises a core 410. The core 410 may be a glass substrate. In an embodiment, the core 410 may have a thickness that is between approximately 50 μm and approximately 1,000 μm. A plurality of via openings 417 may be formed through a thickness of the core 410 from a first surface 421 to a second surface 422. In an embodiment, the via openings 417 may be considered high aspect ratio openings. In a particular embodiment, the aspect ratio of the via openings 417 may be approximately 10:1 or greater.

In an embodiment, the via openings 417 may be formed with a laser assisted etching process, such as the processes described in greater detail above. Accordingly, the via openings 417 may include some degree of diameter reduction through their thicknesses. As shown in FIG. 4A, the via openings 417 may include a top end 411, a middle region 412, and bottom end 413. The top end 411 and the bottom end 413 may have substantially vertical sidewalls, and the middle region 412 may include tapered sidewalls.

Figure 4B:
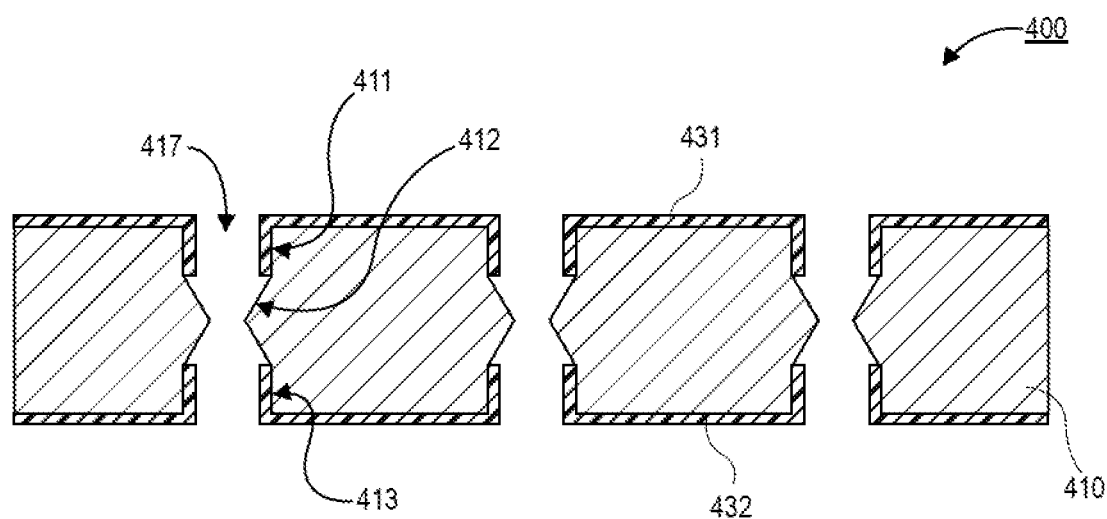

Referring now to FIG. 4B, a cross-sectional illustration of the electronic package 400 after a hardmask is disposed over the core 410 is shown, in accordance with an embodiment. In an embodiment, a first hardmask 431 may be disposed over the first surface 421 and a second hardmask 432 may be disposed over the second surface 422. The first hardmask 431 may also be disposed over the top end 411 of the via opening 417, and the second hardmask 432 may also be disposed over the bottom end 413 of the via opening 417. In an embodiment, the first hardmask 431 and the second hardmask 432 may be deposited with a vapor phase deposition technique. This can be a chemical vapor deposition (CVD) process with controlled ingress of vapor into the via opening 417. In an alternative embodiment, a line-of-sight deposition technique may be used. For example, a sputter deposition process like physical vapor deposition that use e-beam, plasma etched, or thermally etched target sources may be used in some embodiments. As illustrated, the middle region 412 of the via opening 417 remains exposed with no overlying hardmask 431 and 432.

In an embodiment, the hardmasks 431 and 432 may be any material that is etch selective to the core 410. For example, an etching chemistry that etches the core 410 at a relatively fast rate may not substantially etch the hardmask material. In some embodiments, the hardmasks 431 and 432 comprise a metal, a metal nitride, a metal oxide, an organic polymer, or an inorganic polymer. In a particular embodiment, the hardmasks 431 and 432 may comprise one or more of chromium, nickel, and titanium. Such materials may sufficiently resist a hydrofluoric acid-based etching solution used to etch the glass core 410. In some embodiments, the hard masks 431 and 432 may only be slightly etch selective to core 410, but can be substantially thicker to protect surfaces 411, 413, 421, and 422.

Figure 4C:
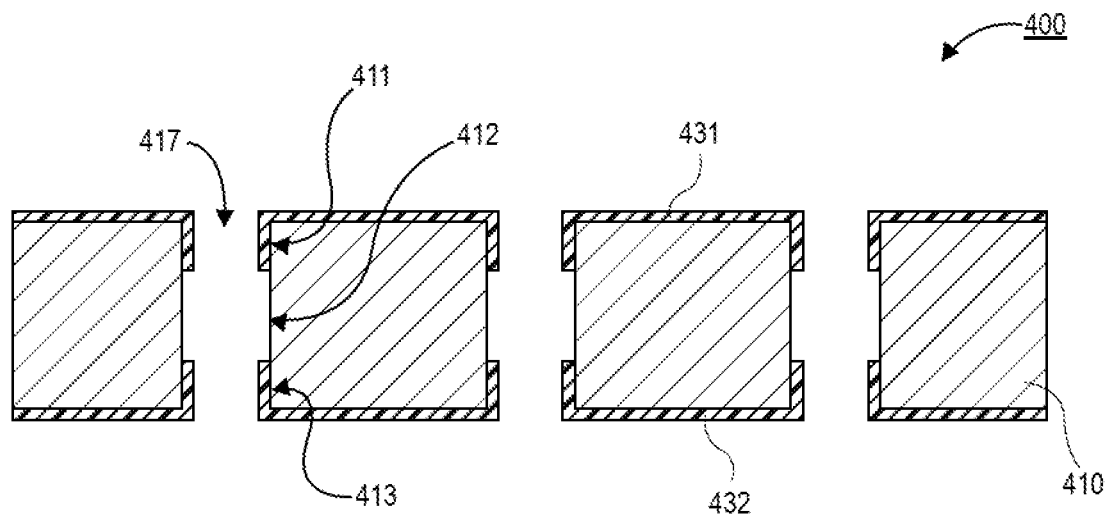

Referring now to FIG. 4C, a cross-sectional illustration of the electronic package 400 after the middle region 412 is recessed is shown, in accordance with an embodiment. In an embodiment, the middle region 412 may be recessed with an etching chemistry, such as a hydrofluoric acid-based or alkali-based etching chemistry. In an embodiment, the etching process may result in the removal of substantially all taper in the via openings 417. For example, the sidewalls in the middle region 412 may be substantially vertical. Though, it is to be appreciated that the etching process may result in the formation of concave sidewalls at the middle region 412, as will be described in greater detail below.

Figure 4D:
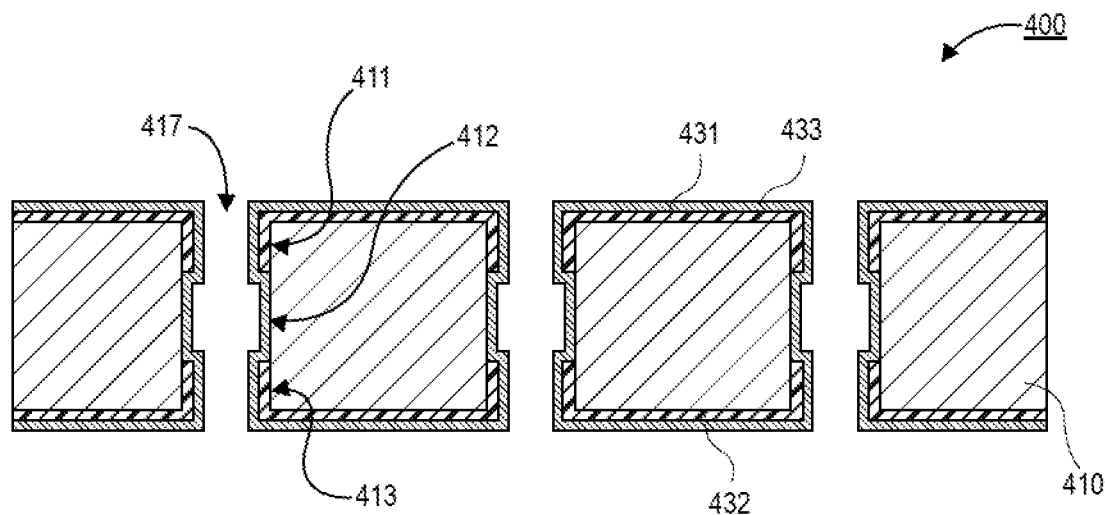

Referring now to FIG. 4D, a cross-sectional illustration of the electronic package 400 after a seed layer 433 is disposed over the core 410 is shown, in accordance with an embodiment. In the case of metal or other electrically conductive hardmask materials, the hardmasks 431 and 432 may remain on the core 410 while a further metal seed layer 433 is deposited over an entire surface of the core 410. The metallic hardmasks 431 and 432 may aid in conductivity during electrodeposition and adhesion of the subsequently deposited metal fill material. In some embodiments, an adhesion layer may be included to better adhere hardmasks 431 and 432 to the core 410 and/or metal seed layer 433 to the core. The seed layer 433 may be deposited with a non-line of sight deposition process, such as atomic layer deposition (ALD) or the like. As shown, the seed layer 433 may directly contact the core 410 at the middle region 412. The remainder of the seed layer 433 may directly contact the hardmasks 431 and 432. In some embodiments, the seed layer 433 may be in direct contact with an adhesion layer (e.g., SiNx, TiNx, TiOx, adhesive polymers, and the like).

Figure 4E:
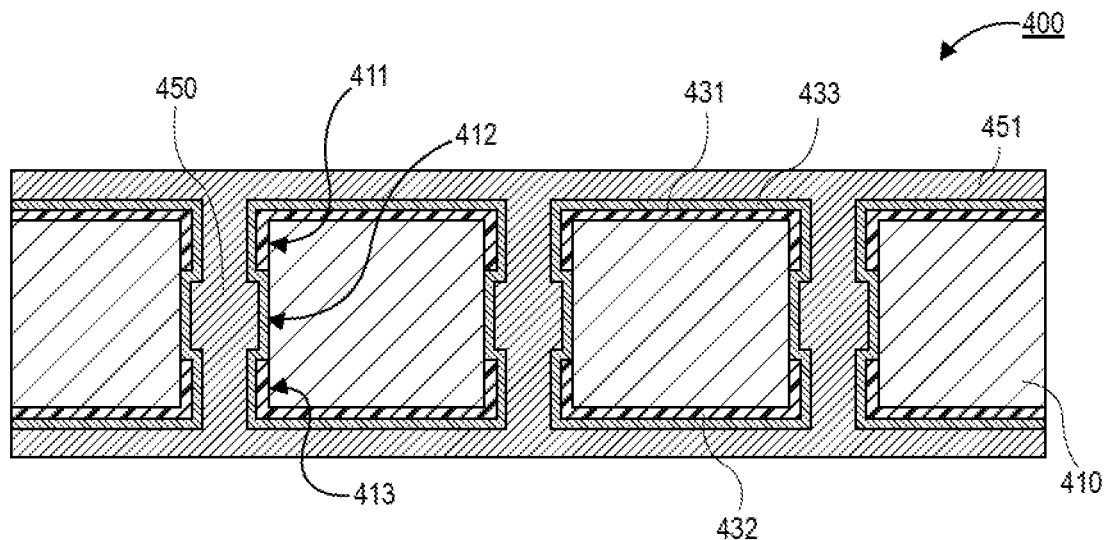

Referring now to FIG. 4E, a cross-sectional illustration of the electronic package 400 after vias 450 are formed in the via openings 417 is shown, in accordance with an embodiment. In an embodiment, the vias 450 may be formed with an electroplating process. As such, overburden 451 may also deposit over the top and bottom surfaces of the core 410. In some embodiments, a polishing process or a patterning process may be used to remove the overburden 451 in order to electrically isolate the vias 450 from each other.

Referring now to FIGS. 5A-5E, a series of cross-sectional illustrations depicting a process for forming a via 550 in a via opening 517 is shown, in accordance with an embodiment. In an embodiment, the via opening 517 includes a continuously tapered sidewall. A middle portion of the sidewall is selectively etched in order to mitigate the diameter narrowing. In some embodiments, the selective etching results in a sidewall of the via opening 517 that is concave. The concave sidewall of the via opening 517 results in a via 550 with a convex surface.

Figure 5A:
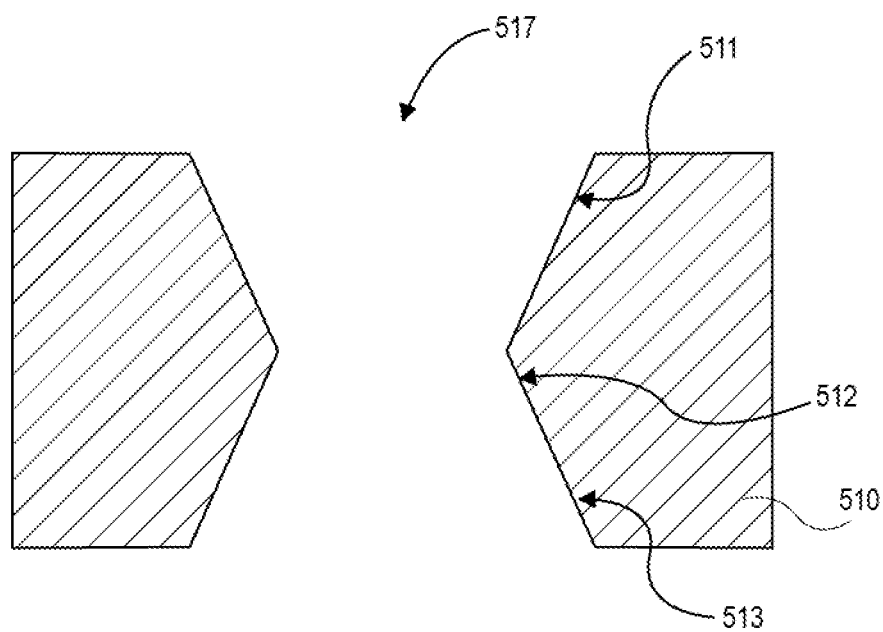
FIGS. 5A-5E are cross-sectional illustrations depicting a process for forming via openings with a concave middle region, in accordance with an embodiment.

Referring now to FIG. 5A, a cross-sectional illustration of a core 510 is shown, in accordance with an embodiment. In an embodiment, the core 510 may be a glass core. The core 510 may have a thickness between approximately 50 μm and approximately 1,000 μm. In an embodiment, a via opening 517 may be formed through a thickness of the core 510. In an embodiment, the via opening 517 is a high aspect ratio opening. For example, an aspect ratio of the via opening 517 may be approximately 10:1 or greater. The via opening 517 may be formed with a laser assisted etching process, such as one described in greater detail above. The via opening 517 may include tapered sidewalls. For example, a top end 511 and a bottom end 513 may be sloped. A middle region 512 may also be sloped.

Figure 5B:
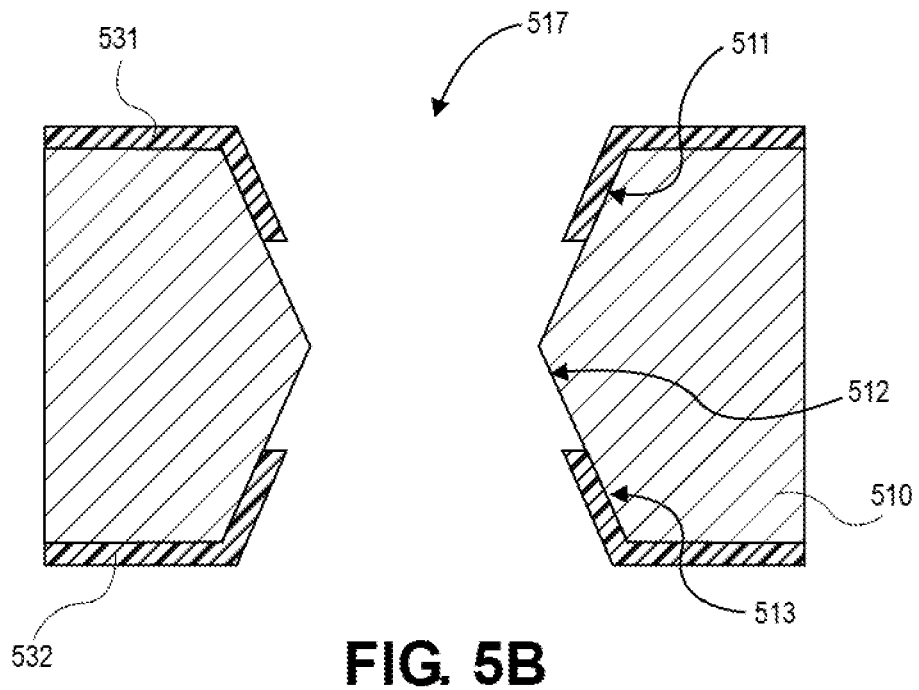

Referring now to FIG. 5B, a cross-sectional illustration of the core 510 after hardmasks 531 and 532 are disposed over the core 510 is shown, in accordance with an embodiment. In an embodiment, the first hardmask 531 may be disposed over the top surface of the core 510 and the second hardmask 532 may be disposed over the bottom surface of the core 510. The first hardmask 531 may also be disposed over the top end 511 of the via opening 517, and the second hardmask 532 may also be disposed over the bottom end 513 of the via opening 517. In an embodiment, the first hardmask 531 and the second hardmask 532 may be deposited with a vapor phase deposition technique. This can be a CVD process with controlled ingress of vapor into the via opening 517. In an alternative embodiment, a line-of-sight deposition technique may be used. For example, a sputter deposition process like physical vapor deposition (PVD). For example, a sputter deposition process using e-beam or plasma may be used. As illustrated, the middle region 512 of the via opening 517 remains exposed with no overlying hardmask 531 and 532.

In an embodiment, the hardmasks 531 and 532 may be any material that is etch selective to the core 510. For example, an etching chemistry that etches the core 510 at a relatively fast rate may not substantially etch the hardmask material. In some embodiments, the hardmasks 531 and 532 may be substantially similar compositions as the hardmasks 431 and 432 described above.

Figure 5C:
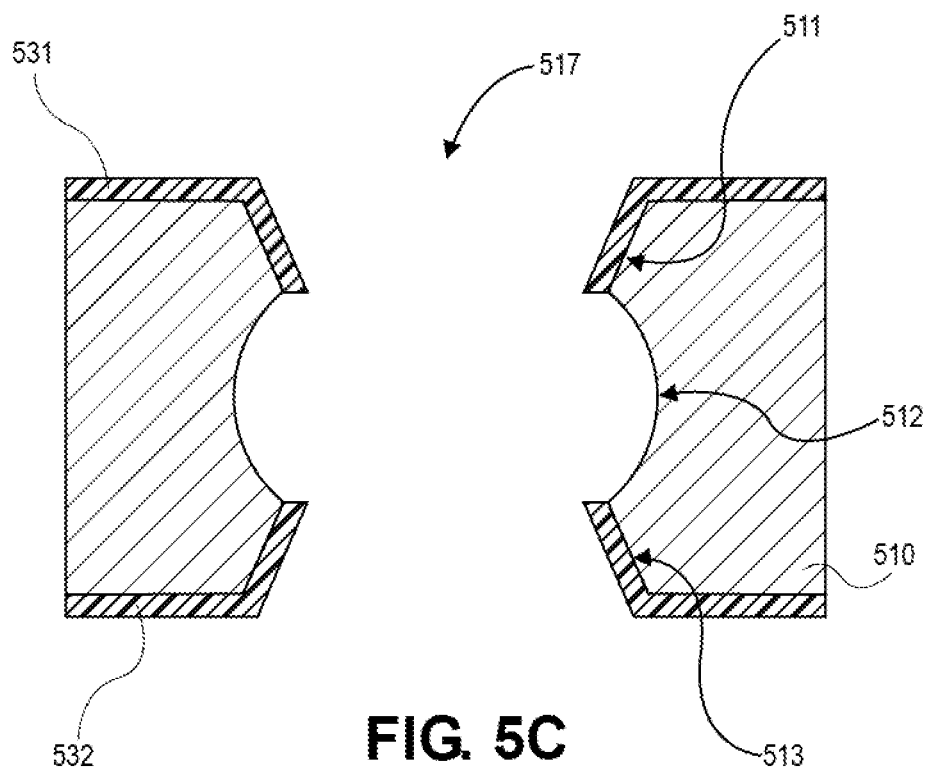

Referring now to FIG. 5C, a cross-sectional illustration of the core 510 after the middle region 512 is recessed is shown, in accordance with an embodiment. In an embodiment, the middle region 512 may be recessed with an etching chemistry, such as a hydrofluoric acid-based etching chemistry. As is typical of many wet etching chemistries, the etching of the exposed middle region 512 may be isotropic. The isotropic nature of the etching chemistry may result in the formation of a substantially concave surface at the middle region 512. Accordingly, the resulting via opening 517 may have a sloped top end 511 and a sloped bottom end 513 with a concave middle region 512 between the two. That is, at the junction between the top end 511 and the middle region 512, the slope of the sidewall may change direction.

Figure 5D:
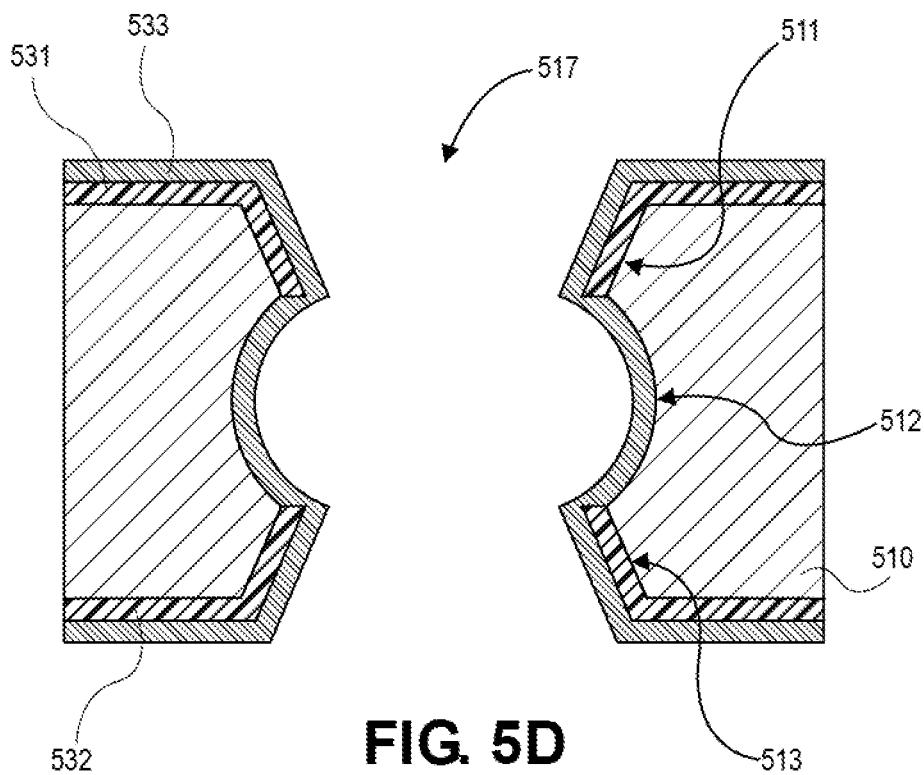

Referring now to FIG. 5D, a cross-sectional illustration of the core 510 after a seed layer 533 is deposited is shown, in accordance with an embodiment. In the case of metal or other electrically conductive hardmask materials, the hardmasks 531 and 532 may remain on the core 510 while a further metal seed layer 533 is deposited over an entire surface of the core 510. The metallic hardmasks 531 and 532 may aid in conductivity during electrodeposition and adhesion of the subsequently deposited metal fill material. The seed layer 533 may be deposited with a non-line of sight deposition process, such ALD or the like. As shown, the seed layer 533 directly contacts the core 510 at the middle region 512. The remainder of the seed layer 533 may directly contact the hardmasks 531 and 532.

Figure 5E:
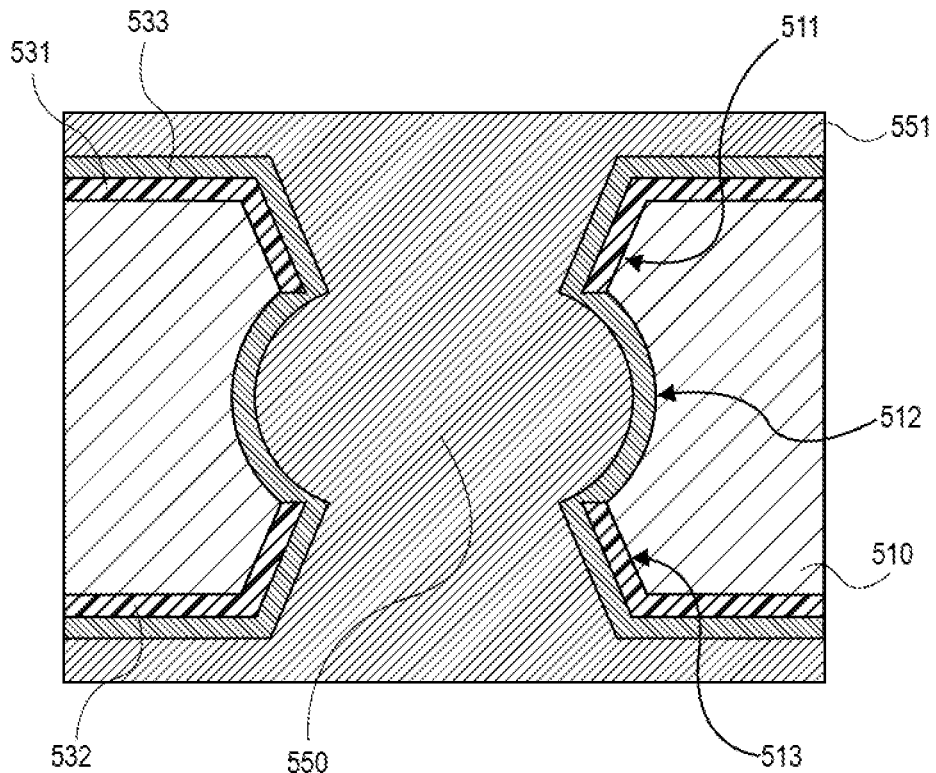

Referring now to FIG. 5E, a cross-sectional illustration of the electronic core 510 after a via 550 is formed in the via opening 517 is shown, in accordance with an embodiment. In an embodiment, the via 550 may be formed with an electroplating process. As such, overburden 551 may also deposit over the top and bottom surfaces of the core 510. In some embodiments, a polishing process or a patterning process may be used to remove the overburden 551 in order to electrically isolate the via 550 from other structures.

Referring now to FIGS. 6A-6D, a series of cross-sectional illustrations depicting a process for forming blind vias is shown, in accordance with an embodiment. As shown, the blind vias have a sloped portion that is widened by masking a top portion of the via opening and etching out the remaining bottom portion. As such, a blind feature with a wider bottom is provided.

Figure 6A:
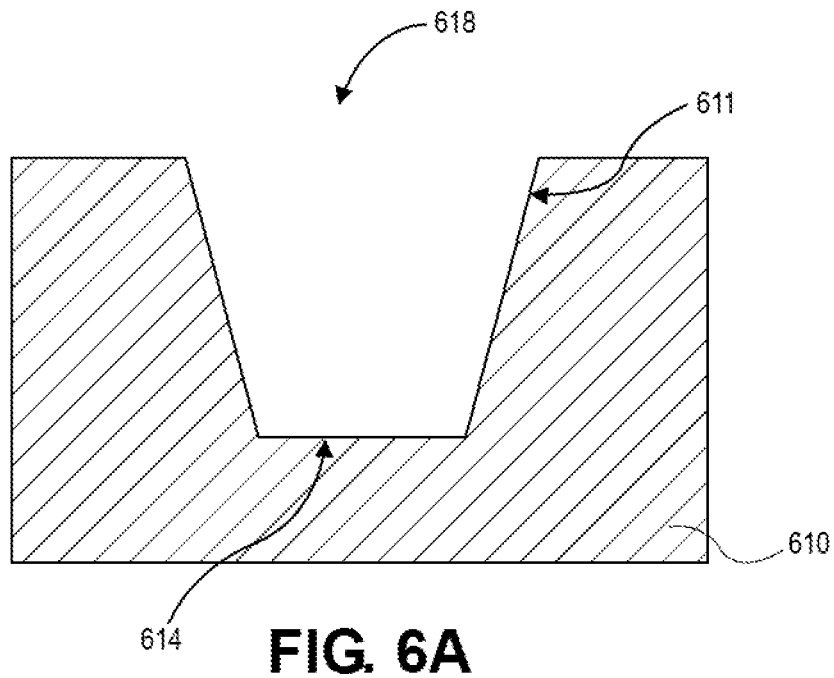
FIGS. 6A-6D are cross-sectional illustrations depicting a process for forming blind via structures with a reduced taper, in accordance with an embodiment.

Referring now to FIG. 6A, a cross-sectional illustration of a core 610 is shown, in accordance with an embodiment. In an embodiment, the core 610 comprises a blind via opening 618. That is, the via opening 618 does not pass entirely through a thickness of the core 610. Instead of passing through the core 610, the via opening 618 comprises a bottom surface 614. Additionally, the via opening 618 includes a sloped sidewall 611.

Figure 6B:
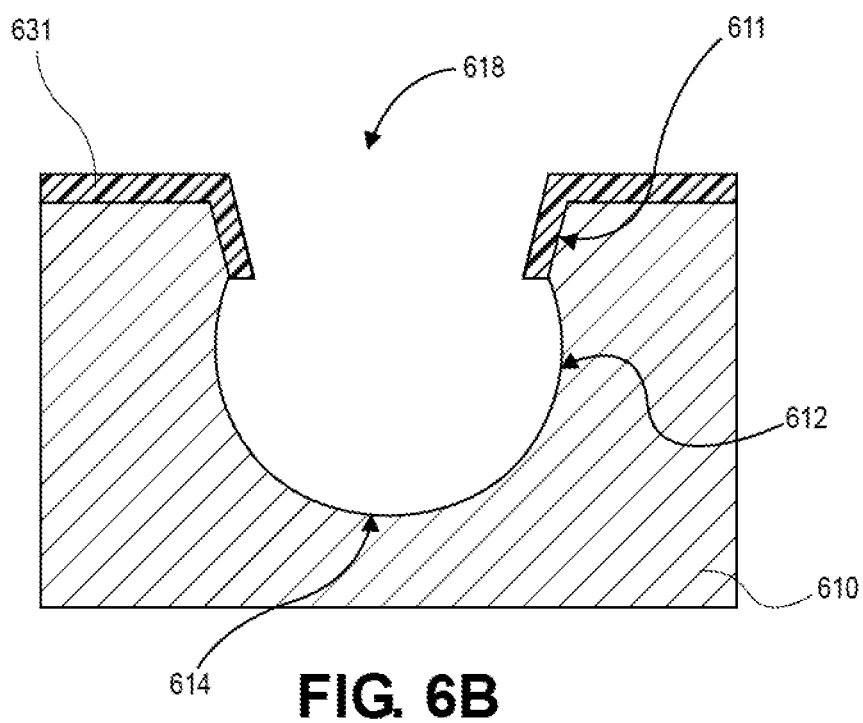

Referring now to FIG. 6B, a cross-sectional illustration of the core 610 after a hardmask 631 is deposited and the unexposed regions are etched is shown, in accordance with an embodiment. As shown, the hardmask 631 may cover a top surface of the core 610 and a top portion of the sloped sidewalls 611. In an embodiment, the hardmask 631 may be similar to the hardmasks described in greater detail above. The middle region 612 and the bottom surface 614 may not be covered by the hardmask 631. Accordingly, the middle region 612 and the bottom surface 614 may exhibit a profile characteristic of an isotropic etching process. For example, the middle region 612 and the bottom surface 614 may be curved.

Figure 6C:
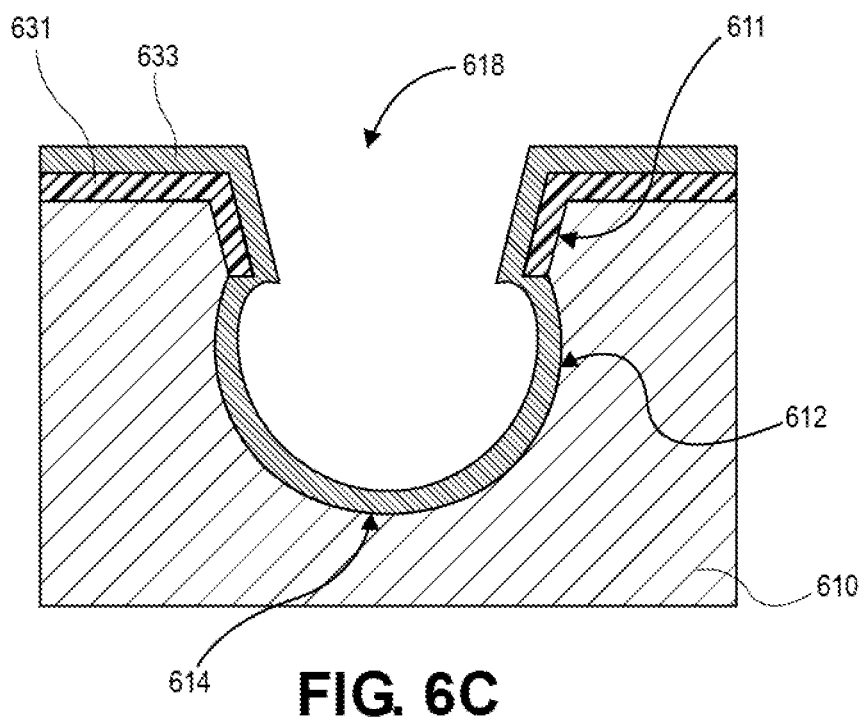

Referring now to FIG. 6C, a cross-sectional illustration of the core 610 after a seed layer 633 is disposed over the exposed surfaces is shown, in accordance with an embodiment. In an embodiment, the seed layer 633 may be directly contacting the core 610 at the middle region 612 and the bottom surface 614 of the blind via opening 618. Although, not shown here an adhesion layer may be present between glass and metal seed layer, e.g. TiNx, TiOx, SiNx, and/or organic polymer. The remainder of the seed layer 633 may be provided over a surface of the hardmask 631.

Figure 6D:
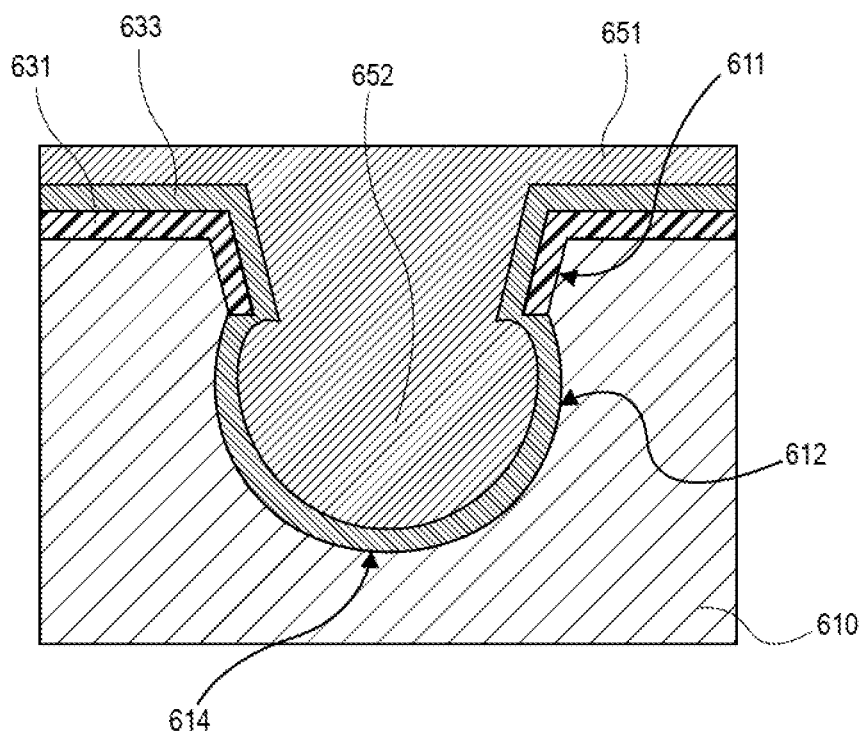

Referring now to FIG. 6D, a cross-sectional illustration of the core 610 after a blind via 652 is disposed in the blind via opening 618 is shown, in accordance with an embodiment. The blind via 652 may be deposited with an electroplating process or the like. In some embodiments, an overburden portion 651 may also be deposited over a top surface of the core 610. In some embodiments, the overburden 651 may be polished or patterned in order to electrically isolate the blind via 652 from other structures.

As shown, the blind via 652 may have a sloped top region. That is, at a top portion of the blind via 652, a diameter of the blind via 652 may decrease. Upon reaching the middle region 612, the diameter of the blind via 652 may begin increasing. The blind via 652 at the middle region 612 may be rounded. That is, a profile of the blind via 652 may transition from a sloped edge to a rounded edge at the middle region 612.

In the embodiments described above, the hardmask layer (or layers) persist into the final structure. However, it is to be appreciated that embodiments may also include removing the hardmask layer before forming the seed layer. Embodiments where the hardmask layer has been removed are shown in FIGS. 7A-8B.

Figure 7A:
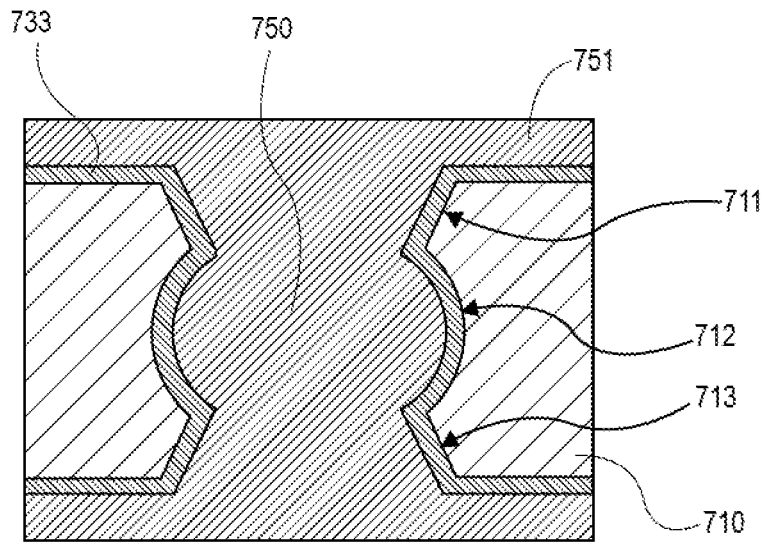
FIG. 7A is a cross-sectional illustration of a via with a top region, a middle region, and a bottom region, where the middle region has convex sidewalls, in accordance with an embodiment.

Referring now to FIG. 7A, a cross-sectional illustration of a core 710 is shown, in accordance with an embodiment. As shown, a via 750 passes through a thickness of the core 710. A top end 711 of the via 750 has a sloped profile, and a bottom end 713 of the via 750 also has a sloped profile. However, at a middle region 712, the via 750 has a convex profile. That is, the core 710 is concave at the middle region 712. As shown, the seed layer 733 may directly contact the core 710 at all locations. In the illustrated embodiment, the overburden 751 is still shown. However, it is to be appreciated that the overburden 751 may be patterned or polished away in order to electrically isolate the via 750 from other features.

Figure 7B:
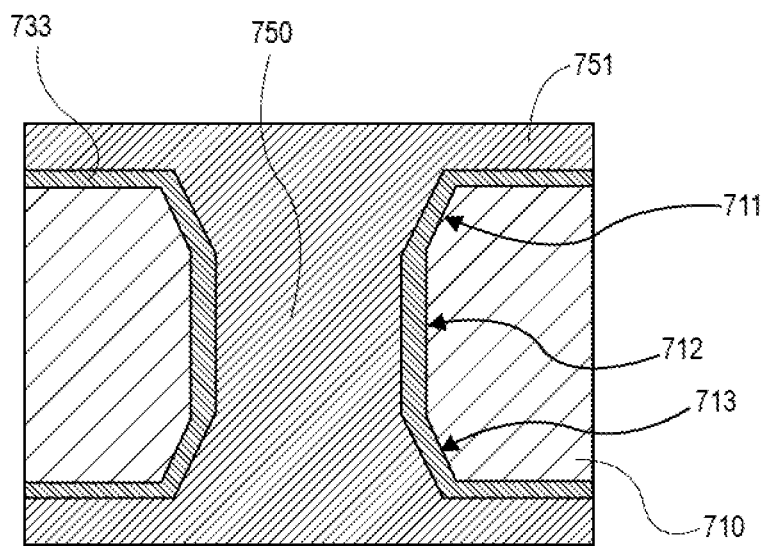
FIG. 7B is a cross-sectional illustration of a via with a top region, a middle region, and a bottom region, where the middle region has vertical sidewalls, in accordance with an embodiment.

Referring now to FIG. 7B, a cross-sectional illustration of a core 710 is shown, in accordance with an additional embodiment. As shown, a via 750 passes through a thickness of the core 710. A top end 711 of the via 750 has a sloped profile, and a bottom end 713 of the via 750 has a sloped profile. However, at a middle region 712, the via 750 has a substantially vertical profile. As shown, the seed layer 733 may directly contact the core 710 at all locations. Though it is to be appreciated that the seed layer 733 may be separated from the core 710 by an adhesion layer. In the illustrated embodiment, the overburden 751 is still shown. However, it is to be appreciated that the overburden 751 may be patterned or polished away in order to electrically isolate the via 750 from other features.

Figure 8A:
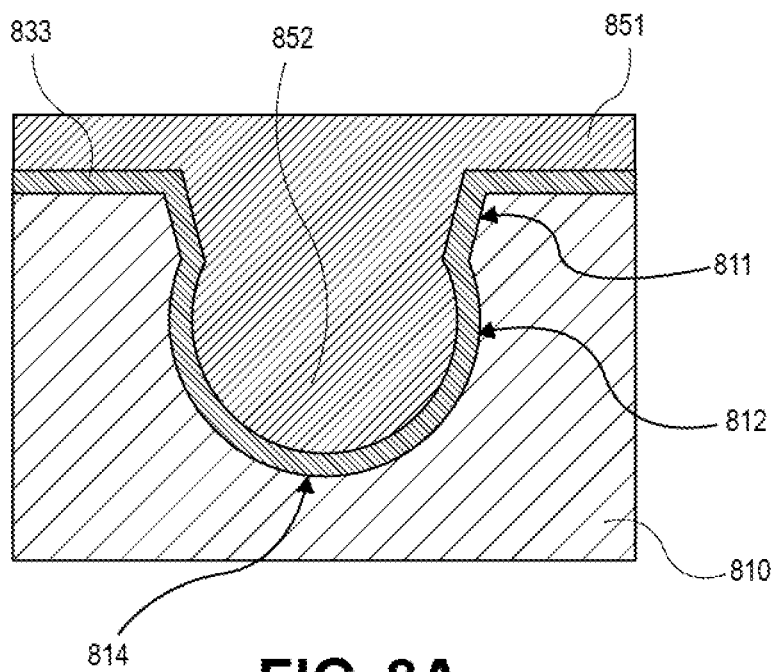
FIG. 8A is a cross-sectional illustration of a blind feature with a top region with sloped sidewalls and a bottom region with curved sidewalls, in accordance with an embodiment.

Referring now to FIG. 8A, a cross-sectional illustration of a core 810 is shown, in accordance with an additional embodiment. As shown, a blind via 852 extends into a surface of the core 810. A top end 811 of the blind via 852 has a sloped profile. However, after the sloped top end 811, the blind via 852 may have a curved profile over the middle region 812 and a bottom surface 814. The curved surface may be characteristic of an isotropic etching process used to remove taper from the blind via 852. As shown, the seed layer 833 may directly contact the core 810 at all locations. In the illustrated embodiment, the overburden 851 is still shown. However, it is to be appreciated that the overburden 851 may be patterned or polished away in order to electrically isolate the blind via 852 from other features.

Figure 8B:
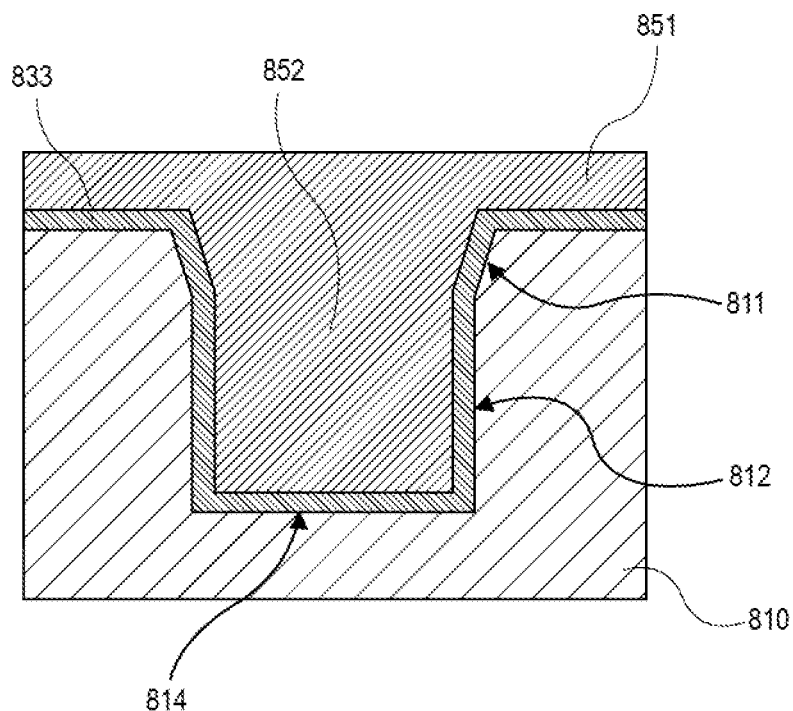
FIG. 8B is a cross-sectional illustration of a blind feature with a top region with sloped sidewalls and a bottom region with vertical sidewalls, in accordance with an embodiment.

Referring now to FIG. 8B, a cross-sectional illustration of a core is shown, in accordance with an additional embodiment. As shown, a blind via 852 extends into a surface of the core 810. A top end 811 of the blind via 852 has a sloped profile. However, after the sloped top end 811, the blind via 852 may have a vertical sidewall at a middle region 812 until reaching a flat bottom surface 814. As shown, the seed layer 833 may directly contact the core 810 at all locations. In the illustrated embodiment, the overburden 851 is still shown. However, it is to be appreciated that the overburden 851 may be patterned or polished away in order to electrically isolate the blind via 852 from other features.

Referring now to FIG. 9, a cross-sectional illustration of an electronic system 990 is shown, in accordance with an embodiment. In an embodiment, the electronic system 990 comprises a board 991. The board 991 may be a printed circuit board (PCB) or the like. In an embodiment, a package substrate is coupled to the board 991 by interconnects 992. For example, the interconnects 992 may be solder balls, sockets, or the like. The package substrate may comprise a core 910 with buildup layers 925 above and/or below the core 910. In an embodiment, the core 910 may comprise one or more vias 950. The vias 950 may be substantially similar to any of the via architectures described in greater detail above. For example, the vias 950 may have sloped top and bottom regions with a convex middle region (i.e., the core 910 is concave at the middle region). In an embodiment, a die 995 may be coupled to the top buildup layers 925 by interconnects 994. Interconnects 994 may be any first level interconnect (FLI) architecture. The die 995 may be a processor, a graphics processor, a memory die, or any other computational die architecture.

Figure 10:
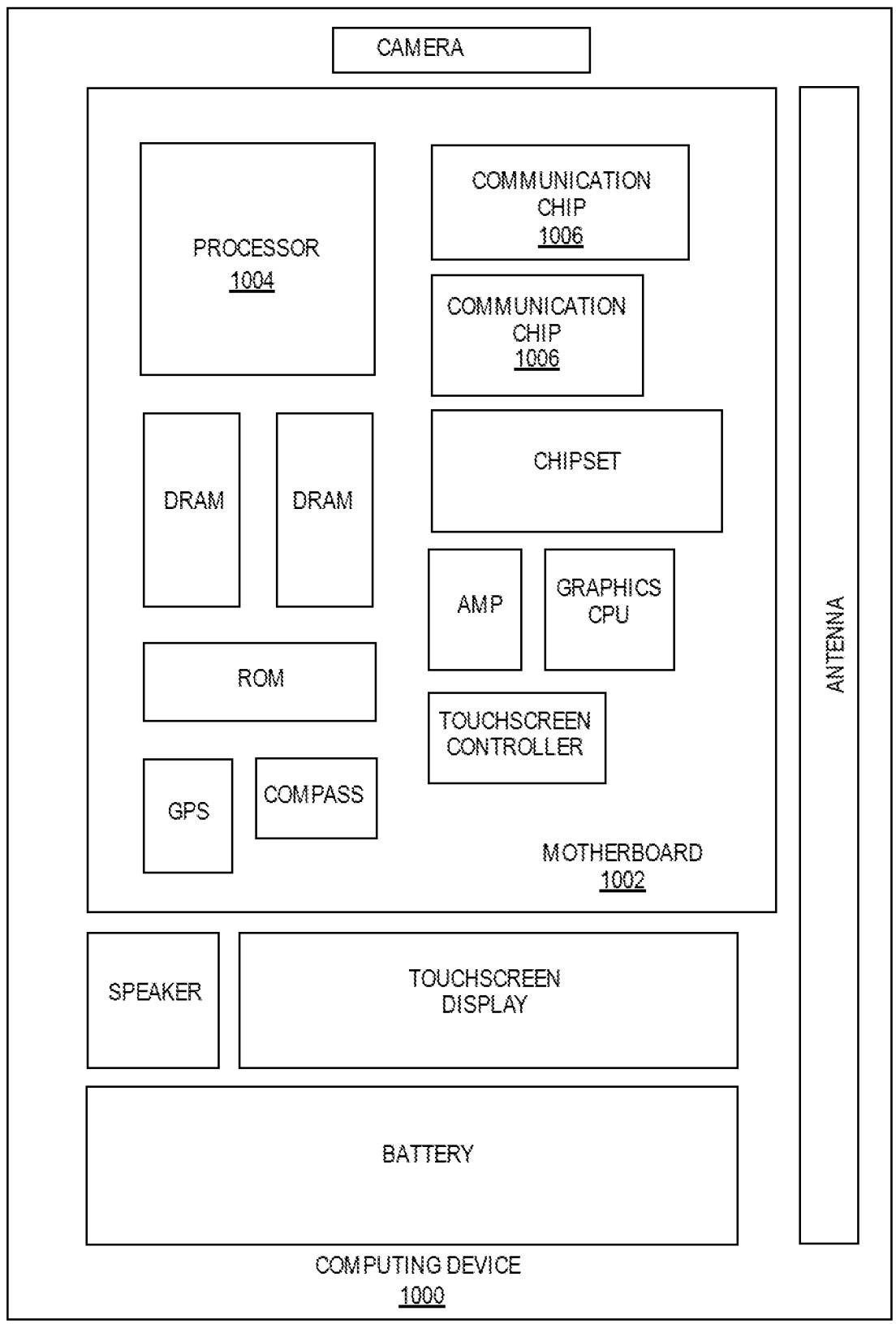
FIG. 10 is a schematic of a computing device built in accordance with an embodiment.

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor may be part of an electronic package that comprises a glass core with a via opening that comprises a top end, a middle region, and a bottom end, where the middle region is a concave surface, in accordance with embodiments described herein. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of the invention, the integrated circuit die of the communication chip may be part of an electronic package that comprises a glass core with a via opening that comprises a top end, a middle region, and a bottom end, where the middle region is a concave surface, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a substrate with a first surface and a second surface opposite from the first surface, wherein the substrate comprises glass; and an opening through the substrate from the first surface to the second surface, wherein the opening comprises: a first end proximate to the first surface of the substrate; a second end proximate to the second surface of the substrate; and a middle region between the first end and the second end, wherein the middle region has a discontinuous slope at junctions with the first end and the second end.

Example 2: the electronic package of Example 1, wherein the middle region is a curved recess.

Example 3: the electronic package of Example 1, wherein the middle region is a substantially vertical sidewall, and wherein the first end and the second end are sloped sidewalls.

Example 4: the electronic package of Examples 1-3, further comprising: a first hardmask over the first end; and a second hardmask over the second end.

Example 5: the electronic package of Example 4, further comprising a seed layer lining the opening, wherein the seed layer is separated from the first end by the first hardmask, wherein the seed layer is separated from the second end by the second hardmask, and wherein the seed layer is in direct contact with the middle region or an adhesion layer.

Example 6: the electronic package of Example 4 or Example 5, wherein the first hardmask and the second hardmask comprise a metal, a metal oxide, a metal nitride, organic polymer, or inorganic polymer.

Example 7: the electronic package of Example 6, wherein the first hardmask and the second hardmask comprise one or more of chromium, nickel, and titanium.

Example 8: the electronic package of Examples 1-7, further comprising: a conductive body filling the opening through the substrate.

Example 9: the electronic package of Example 8, wherein the conductive body is a via.

Example 10: the electronic package of Example 8, wherein the conductive body is a plane.

Example 11: the electronic package of Examples 1-10, wherein an aspect ratio of the opening is approximately 10:1 or greater.

Example 12: a method of forming a package substrate, comprising: forming an opening through a substrate, wherein the substrate comprises glass, and wherein the opening comprises: a first end proximate to the first surface of the substrate; a second end proximate to the second surface of the substrate; and a middle region between the first end and the second end; disposing a hardmask over the substrate, wherein the hardmask does not cover the middle region of the opening; etching the substrate, wherein the middle region is recessed to have a slope that is different than a slope of the first end or a slope of the second end; and filling the opening with a conductive material.

Example 13: the method of Example 12, wherein the hardmask is disposed with a chemical vapor deposition (CVD) process with controlled ingress of vapor into the opening.

Example 14: the method of Example 12, wherein the hardmask is disposed with a line-of-sight deposition process.

Example 15: the method of Example 14, wherein the deposition process is a physical vapor deposition (PVD) process including a sputter deposition process using e-beam or plasma.

Example 16: the method of Examples 12-15, wherein the hardmask comprises a metal, a metal oxide, a metal nitride, organic polymer or inorganic polymer material.

Example 17: the method of Examples 12-16, wherein the middle region comprises a concave surface between the first end and the second end.

Example 18: the method of Examples 12-17, wherein the opening has an aspect ratio of 10:1 or greater.

Example 19: the method of Examples 12-18, further comprising: disposing a seed layer over surfaces of the opening before filling the opening with a conductive material.

Example 20: the method of Example 19, wherein the seed layer is disposed over the hardmask.

Example 21: an electronic package, comprising: a core, wherein the core comprises glass; and an opening into the core, wherein the opening comprises: a first sidewall, wherein the first sidewall is sloped; and a second sidewall, wherein the second sidewall is a concave surface.

Example 22: the electronic package of Example 21, wherein the opening is a blind opening, and wherein the second sidewall is directly coupled to a bottom of the opening.

Example 23: the electronic package of Example 21 or Example 22, wherein the opening passes entirely through a thickness of the core.

Example 24: an electronic system, comprising: a board; a package substrate coupled to the board, wherein the package substrate comprises: a substrate with a first surface and a second surface opposite from the first surface, wherein the substrate comprises glass; and an opening through the substrate from the first surface to the second surface, wherein the opening comprises: a first end proximate to the first surface of the substrate; a second end proximate to the second surface of the substrate; and a middle region between the first end and the second end, wherein the middle region has a discontinuous slope at junctions with the first end and the second end; and a die coupled to the package substrate.

Example 25: the electronic system of Example 24, wherein the middle region is a concave surface.

What is claimed is:

1. An electronic package, comprising:
   a substrate with a first surface and a second surface opposite from the first surface, wherein the substrate comprises glass; and
   an opening through the substrate from the first surface to the second surface, wherein the opening comprises:
   a first end proximate to the first surface of the substrate;
   a second end proximate to the second surface of the substrate; and
   a middle region between the first end and the second end, wherein the middle region has a discontinuous slope at junctions with the first end and the second end, and the middle region having a lateral width greater than a minimum lateral width of the opening.

2. The electronic package of claim 1, wherein the middle region is a curved recess.

3. The electronic package of claim 1, further comprising:
   a first hardmask over the first end; and
   a second hardmask over the second end.

4. The electronic package of claim 3, further comprising a seed layer lining the opening, wherein the seed layer is separated from the first end by the first hardmask, wherein the seed layer is separated from the second end by the second hardmask, and wherein the seed layer is in direct contact with the middle region or an adhesion layer.

5. The electronic package of claim 3, wherein the first hardmask and the second hardmask comprise a metal, a metal oxide, a metal nitride, organic polymer, or inorganic polymer.

6. The electronic package of claim 5, wherein the first hardmask and the second hardmask comprise one or more of chromium, nickel, and titanium.

7. The electronic package of claim 1, further comprising:
   a conductive body filling the opening through the substrate.

8. The electronic package of claim 7, wherein the conductive body is a via.

9. The electronic package of claim 7, wherein the conductive body is a plane.

10. The electronic package of claim 1, wherein an aspect ratio of the opening is approximately 10:1 or greater.

11. A method of forming a package substrate, comprising:
    forming an opening through a substrate, wherein the substrate comprises glass, and wherein the opening comprises:
    a first end proximate to the first surface of the substrate;
    a second end proximate to the second surface of the substrate; and
    a middle region between the first end and the second end;
    disposing a hardmask over the substrate, wherein the hardmask does not cover the middle region of the opening;
    etching the substrate, wherein the middle region is recessed to have a slope that is different than a slope of the first end or a slope of the second end, the recessed middle region having a lateral width greater than a minimum lateral width of the opening; and
    filling the opening with a conductive material.

12. The method of claim 11, wherein the hardmask is disposed with a chemical vapor deposition (CVD) process with controlled ingress of vapor into the opening.

13. The method of claim 11, wherein the hardmask is disposed with a line-of-sight deposition process.

14. The method of claim 13, wherein the deposition process is a physical vapor deposition (PVD) process including a sputter deposition process using e-beam or plasma.

15. The method of claim 11, wherein the hardmask comprises a metal, a metal oxide, a metal nitride, organic polymer or inorganic polymer material.

16. The method of claim 11, wherein the middle region comprises a concave surface between the first end and the second end.

17. The method of claim 11, wherein the opening has an aspect ratio of 10:1 or greater.

18. The method of claim 11, further comprising:
    disposing a seed layer over surfaces of the opening before filling the opening with a conductive material.

19. The method of claim 18, wherein the seed layer is disposed over the hardmask.

20. An electronic system, comprising:
    a board;
    a package substrate coupled to the board, wherein the package substrate comprises:
    a substrate with a first surface and a second surface opposite from the first surface, wherein the substrate comprises glass; and
    an opening through the substrate from the first surface to the second surface, wherein the opening comprises:
    a first end proximate to the first surface of the substrate;
    a second end proximate to the second surface of the substrate; and
    a middle region between the first end and the second end, wherein the middle region has a discontinuous slope at junctions with the first end and the second end, and the middle region having a lateral width greater than a minimum lateral width of the opening; and
    a die coupled to the package substrate.

21. The electronic system of claim 20, wherein the middle region is a concave surface.

* * * * *